US010027290B2

(12) United States Patent
De Vries

(10) Patent No.: US 10,027,290 B2
(45) Date of Patent: Jul. 17, 2018

(54) SWITCHLESS LINE-DI/MIC PRE-AMPLIFIER INPUT

(71) Applicant: Tymphany HK Limited, Hong Kong (CN)

(72) Inventor: Sebastiaan De Vries, Donggua Ling (CN)

(73) Assignee: TYMPHANY HK LIMITED, Hong Kong (CN)

( * ) Notice: Subject to any disclaimer, the term of this patent is extended or adjusted under 35 U.S.C. 154(b) by 0 days.

(21) Appl. No.: 15/606,184

(22) Filed: May 26, 2017

(65) Prior Publication Data

US 2017/0346451 A1    Nov. 30, 2017

Related U.S. Application Data

(60) Provisional application No. 62/341,963, filed on May 26, 2016.

(51) Int. Cl.
| H03F 99/00 | (2009.01) |
| H03F 1/56 | (2006.01) |
| H03F 3/183 | (2006.01) |
| H03F 3/45 | (2006.01) |
| H04R 3/00 | (2006.01) |
| H03F 1/32 | (2006.01) |
| H03F 3/185 | (2006.01) |
| H03F 1/02 | (2006.01) |
| H03F 1/08 | (2006.01) |
| H03F 3/08 | (2006.01) |
| H03F 3/60 | (2006.01) |
| H04R 5/033 | (2006.01) |
| H04R 5/04 | (2006.01) |

(52) U.S. Cl.
CPC .............. *H03F 1/56* (2013.01); *H03F 1/0227* (2013.01); *H03F 1/083* (2013.01); *H03F 1/3205* (2013.01); *H03F 3/087* (2013.01); *H03F 3/183* (2013.01); *H03F 3/185* (2013.01); *H03F 3/45475* (2013.01); *H03F 3/601* (2013.01); *H04R 3/00* (2013.01); *H04R 3/005* (2013.01); *H04R 5/033* (2013.01); *H04R 5/04* (2013.01); *H03F 2200/03* (2013.01); *H03F 2200/387* (2013.01)

(58) Field of Classification Search
USPC ......................... 381/58–59, 74, 77–81, 120
See application file for complete search history.

(56) References Cited

U.S. PATENT DOCUMENTS

| 7,522,735 B2* | 4/2009 | Van Tassel ........... G10H 1/0091 |
| | | 381/118 |
| 2005/0089175 A1* | 4/2005 | Van Tassel ........... G10H 1/0091 |
| | | 381/63 |

\* cited by examiner

*Primary Examiner* — Disler Paul
(74) *Attorney, Agent, or Firm* — Cantor Colburn LLP

(57) ABSTRACT

A switchless pre-amplifier input circuit includes an audio input connector that receives a first audio device operable at a first impedance and a second audio device operable at a second impedance less than the first impedance. A preamplifier circuit outputs a preamplified audio signal in response to amplifying a first audio signal generated by the first audio device or a second audio signal generated by the second audio device. The switchless pre-amplifier input circuit further includes a impedance selector circuit that adjusts an impedance at the output to reach the second impedance in response to connecting the second audio device to the audio input connector and to adjust the impedance at the output to reach the first impedance in response to connecting the first audio device to the audio input.

8 Claims, 12 Drawing Sheets

SWITCHLESS LINE-DI/MIC PRE-AMPLIFIER INPUT

CROSS-REFERENCE TO RELATED APPLICATIONS

The present application claims priority to U.S. Provisional Application No. 62/341,963, filed on May 26, 2016, the contents of which are incorporated by reference herein in its entirety.

BACKGROUND

The present disclosure relates to audio applications, and more specifically, to audio amplifier circuits.

Conventional audio amplifiers typically require switchable microphone lines that provide low current DC output or are highly expensive. In addition, audio amplifier circuits can include an audio mixer circuit, which includes an analog input stage. The mixer analog input stage is typically designed to handle various different kinds of audio input signals. For example, the mixer analog input stage may receive a medium to high impedance (e.g., 20 kilo ohm to 2 Mega ohm) line/DI input or a low-impedance (600 ohm to 3 kilo-ohm) microphone input.

SUMMARY

According to one embodiment, pre-amplifier circuit is provided including a microphone pre-amplifier stage. The microphone pre-amplifier stage including a direct injection (DI) unit that provides a high impedance source signal and a low impedance XLR connection operable without a line or mic switch. The pre-amplifier circuit further includes self-biasing input component (e.g., transistor pairs) that bias input to an analog-to-digital converter (ADC). In this manner, a low cost, high current DC coupled headphone output is provided.

According to at least one non-limiting embodiment, a switchless pre-amplifier input circuit includes an audio input connector that receives a first audio device operable at a first impedance and a second audio device operable at a second impedance less than the first impedance. A preamplifier circuit outputs a preamplified audio signal in response to amplifying a first audio signal generated by the first audio device or a second audio signal generated by the second audio device. The switchless pre-amplifier input circuit further includes a impedance selector circuit that adjusts an impedance at the output to reach the first impedance in response to connecting the first audio device to the audio input connector and to adjust the impedance at the output to reach the second impedance in response to connecting the second audio device to the audio input.

According to another non-limiting embodiment, a method of operating a switchless pre-amplifier input circuit comprises receiving, at an audio input connector, a first audio device operable at a first impedance and a second audio device operable at a second impedance less than the first impedance. The method further comprises adjusting an impedance at an output of an impedance selector circuit to reach the first impedance in response to connecting the first audio device to the audio input connector, and adjusting the impedance at the output to reach the second impedance in response to connecting the second audio device to the audio input. The method further comprises outputting a preamplified audio signal, via the preamplifier circuit, in response to amplifying a first audio signal generated by the first audio device or a second audio signal generated by the second audio device.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 2:
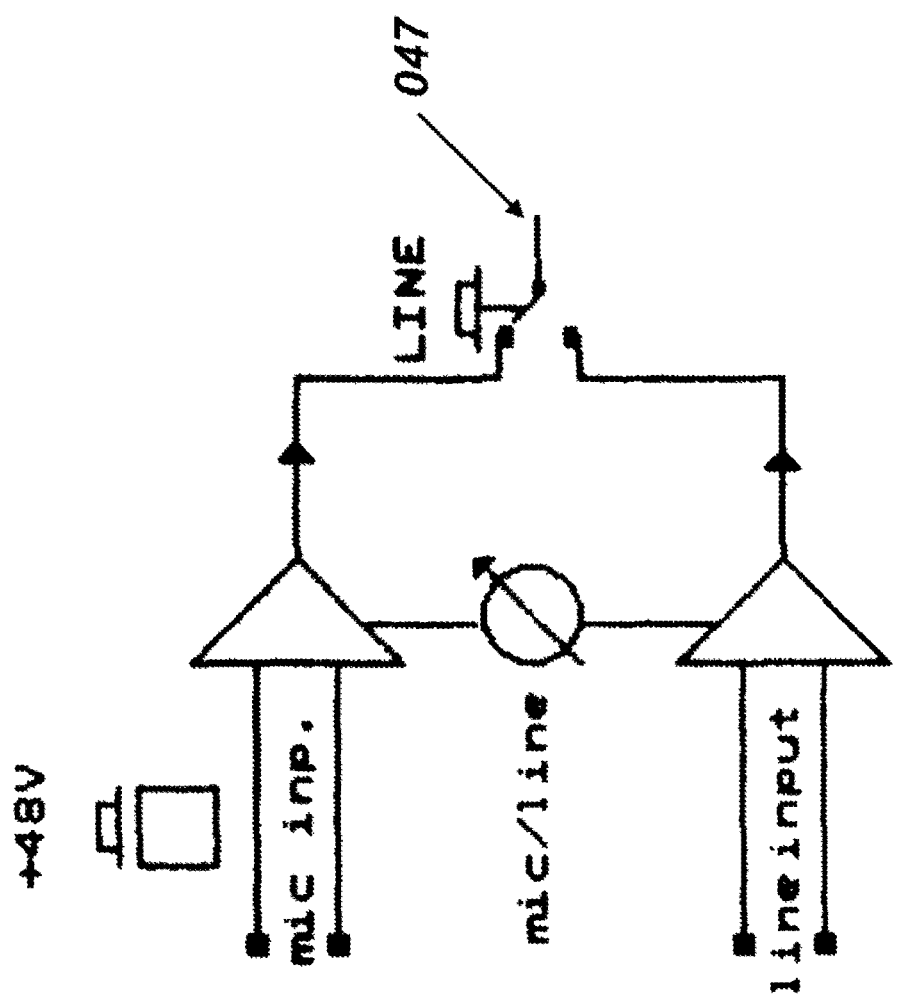
FIG. 2 is a schematic diagram of a conventional audio instrument/microphone input circuit.

In order to handle the various different input signals (i.e., some signals that are high-impedance signals and other signals that are low-impedance signals), conventional instrument/microphone input circuits typically require two separate pre-amplifiers. A first pre-amplifier handles the high-impedance signal, while a second pre-amplifier handles the low-impedance signal. In order to select the correct pre-amplifier to handle the incoming signal, the conventional analog input circuit also implements a physical (i.e., mechanical) single pole double throw (SPDT) switch, sometimes referred to as a "Y-switch" (see FIG. 2, switch 047). The mechanical switch 047 consumes space while also increasing the overall cost of the instrument/microphone input circuit.

Various non-limiting embodiments of the invention provide a switchless line-DI/Mic Pre-Amplifier input circuit, referred to herein as a switchless L/M input circuit, which provides an input line for connecting to an instrument device or microphone. The switchless L/M input circuit utilizes a virtual zero-ohm nature of the line/Instruments input operational amplifier (OpAmp) which is coupled to the circuit impedance of a microphone device in response to connecting the microphone device to the input line of the switchless L/M input circuit.

Figure 1:
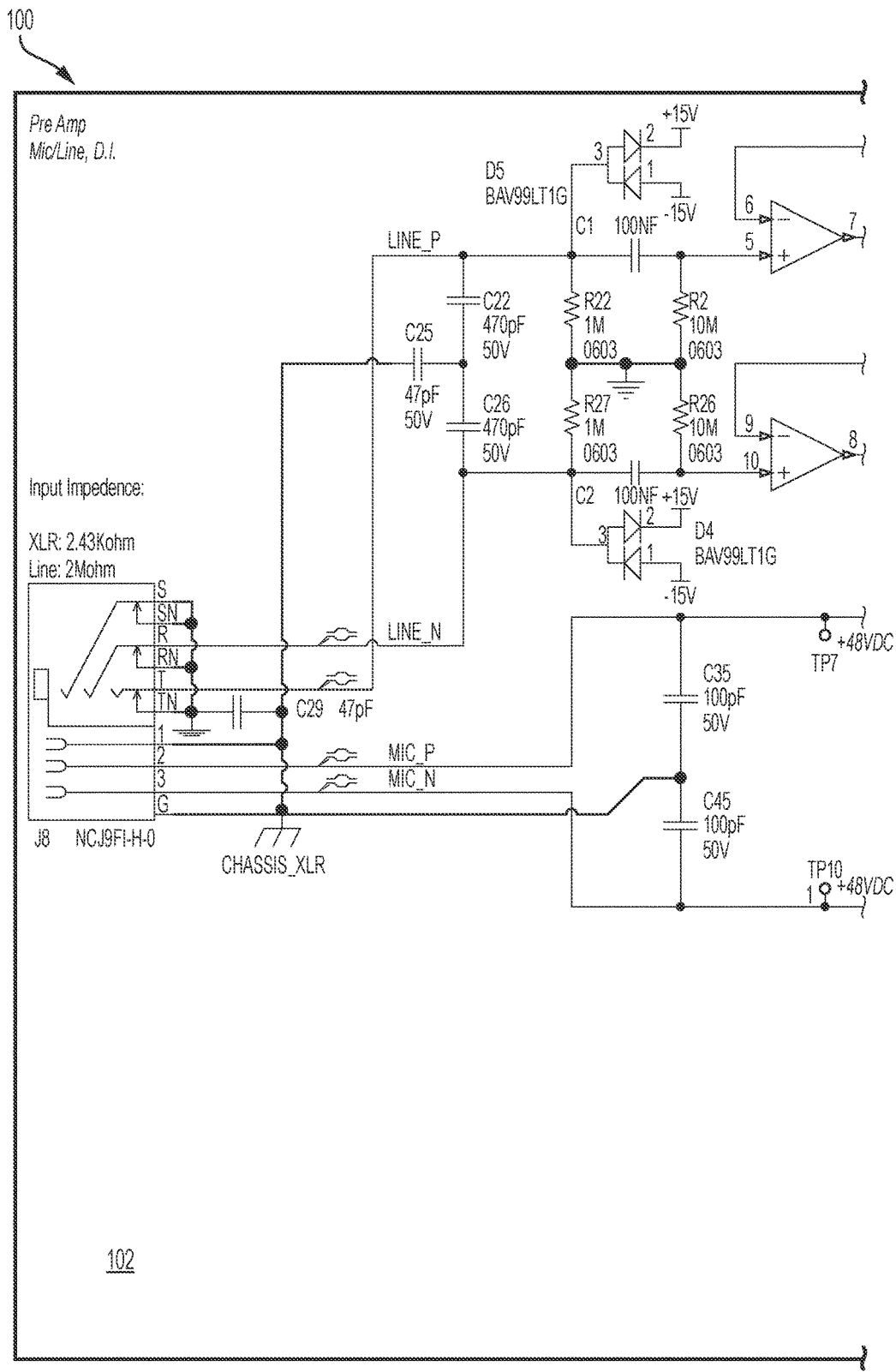
FIG. 1 is a schematic of a pre-amplifier circuit including a microphone pre-amplifier stage having a high-impedance DI unit and low impedance XLR connector that may be operated without line/mic switch according to a non-limiting embodiment.
Figure 1:
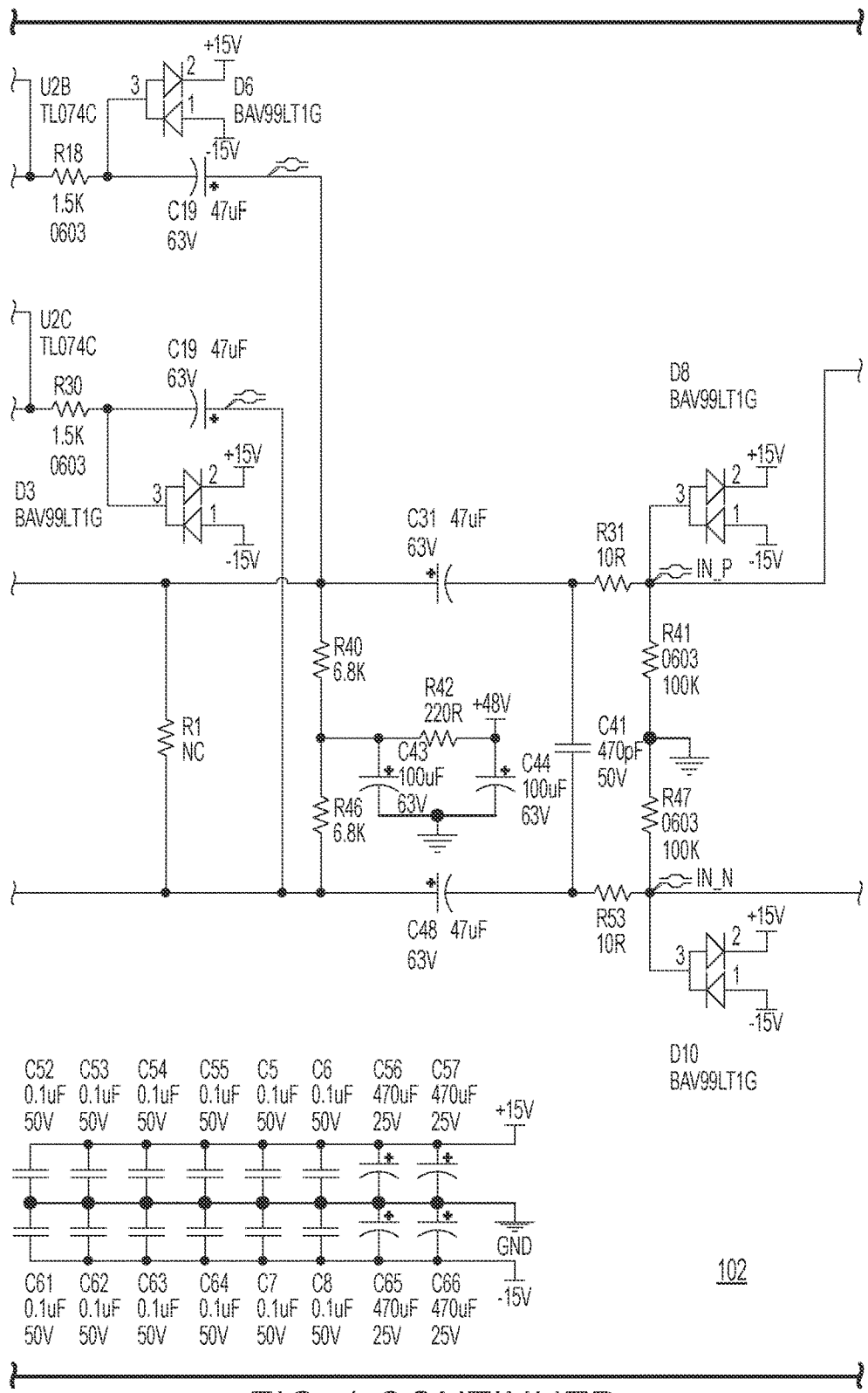
Figure 1:
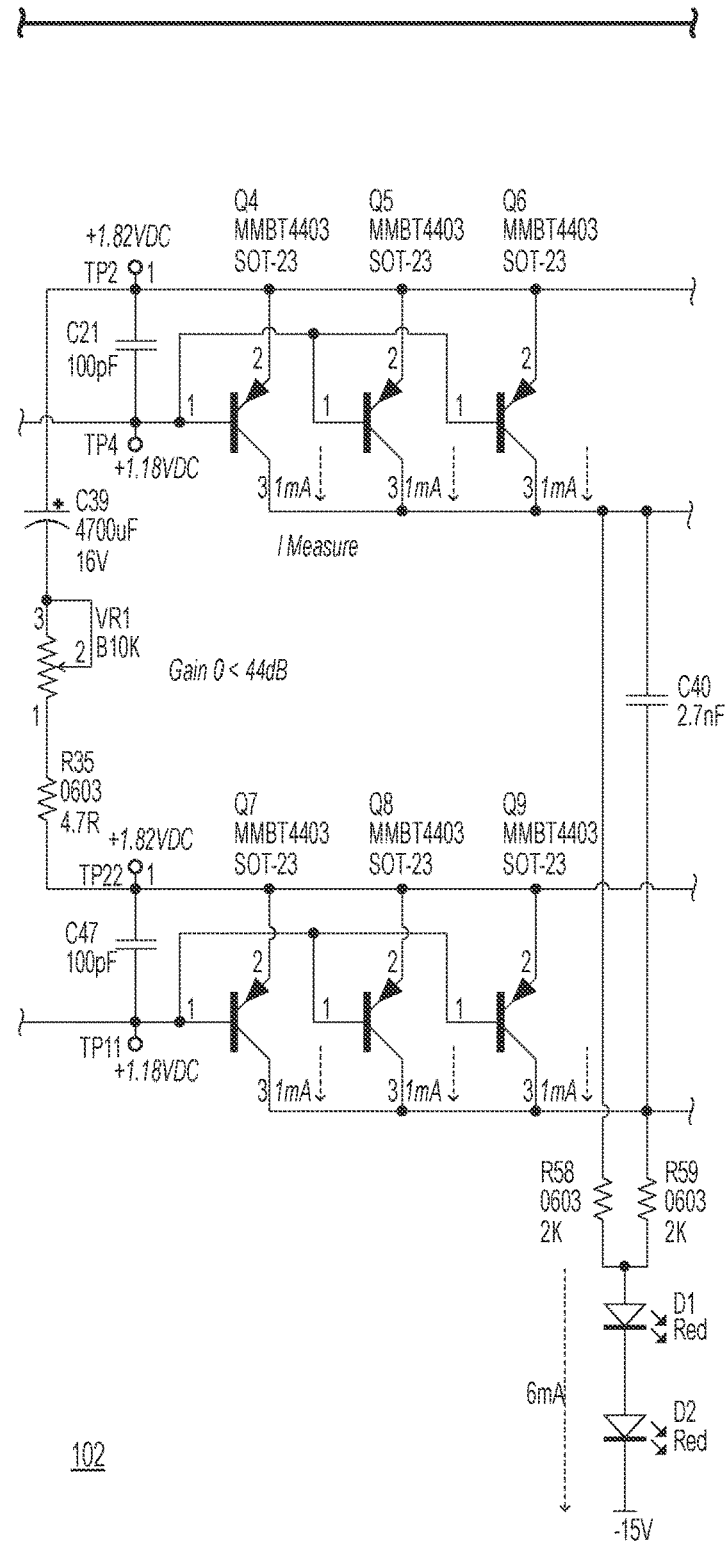
Figure 1:
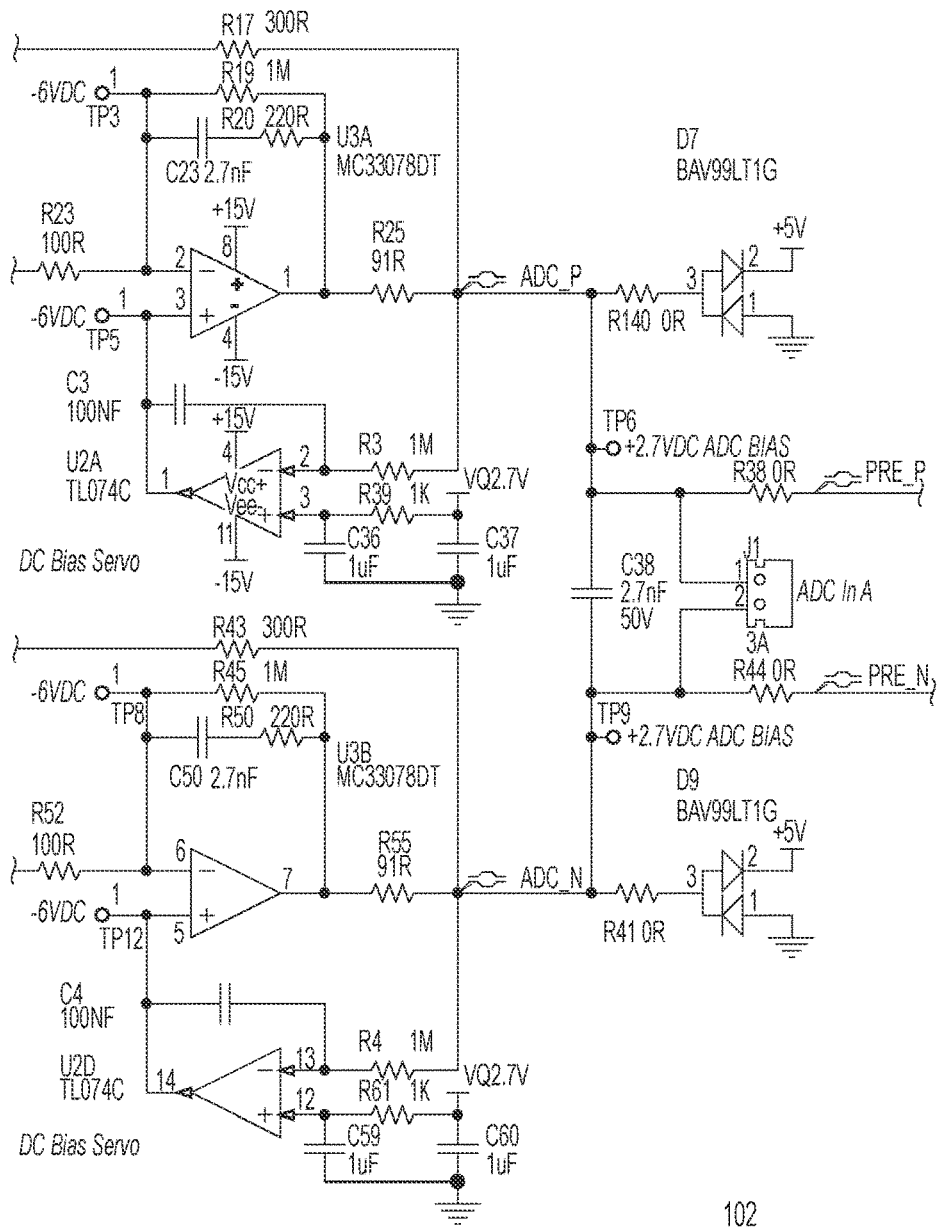
Figure 1:
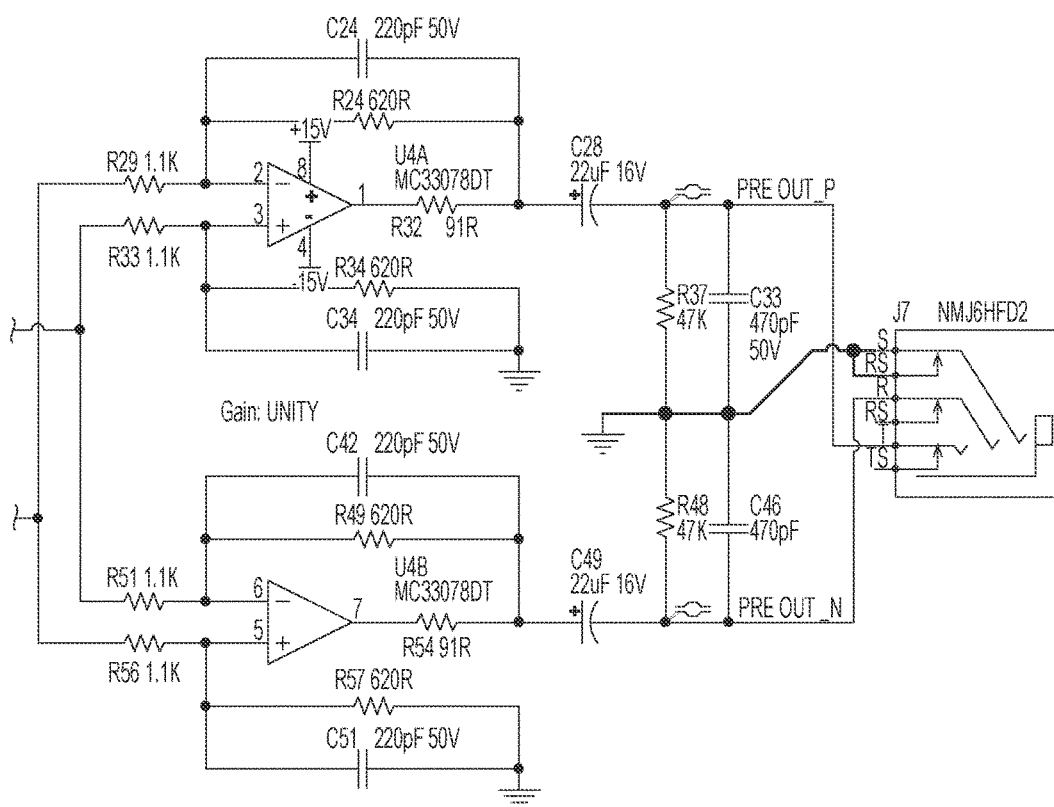
Figure 1:
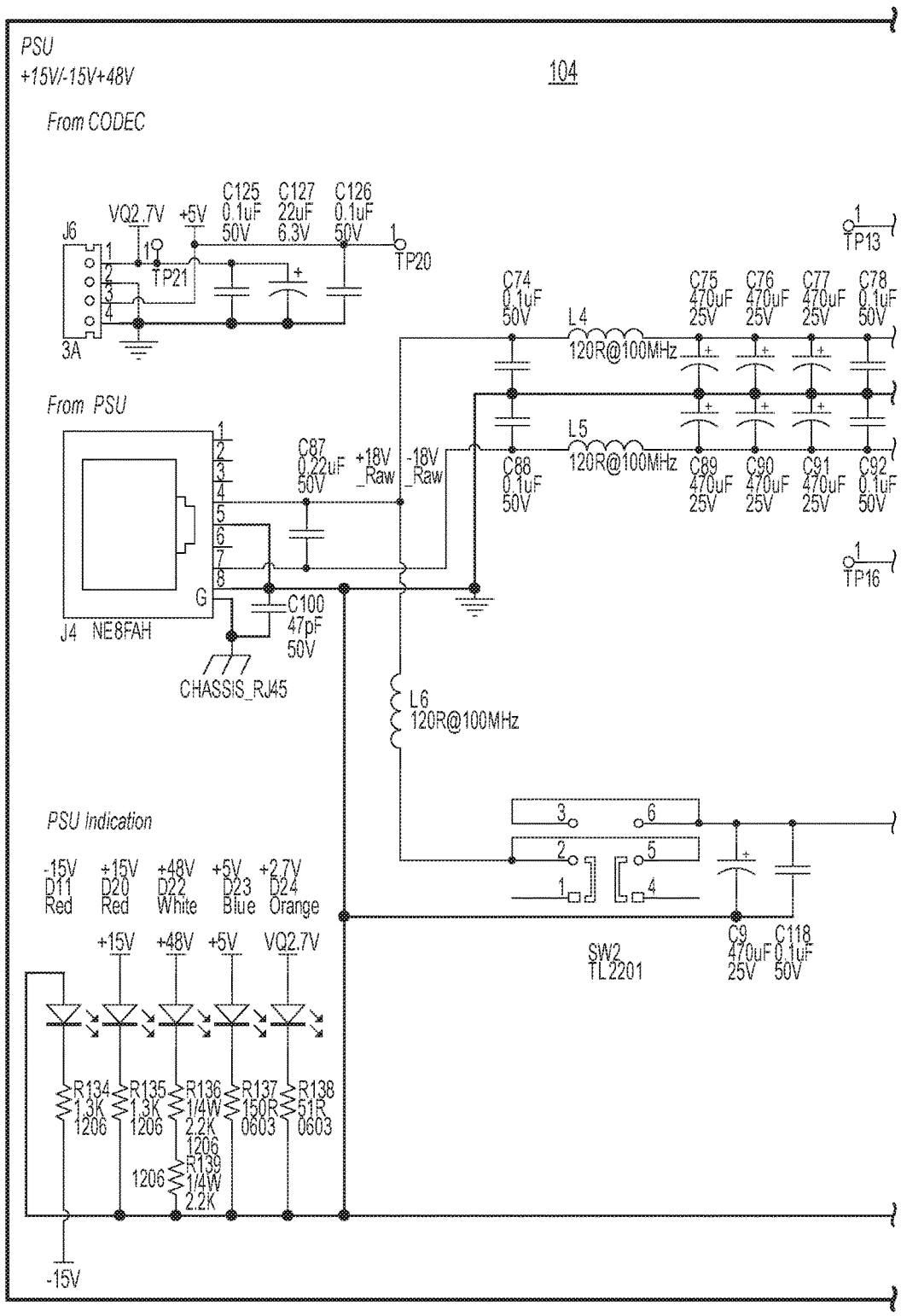
Figure 1:
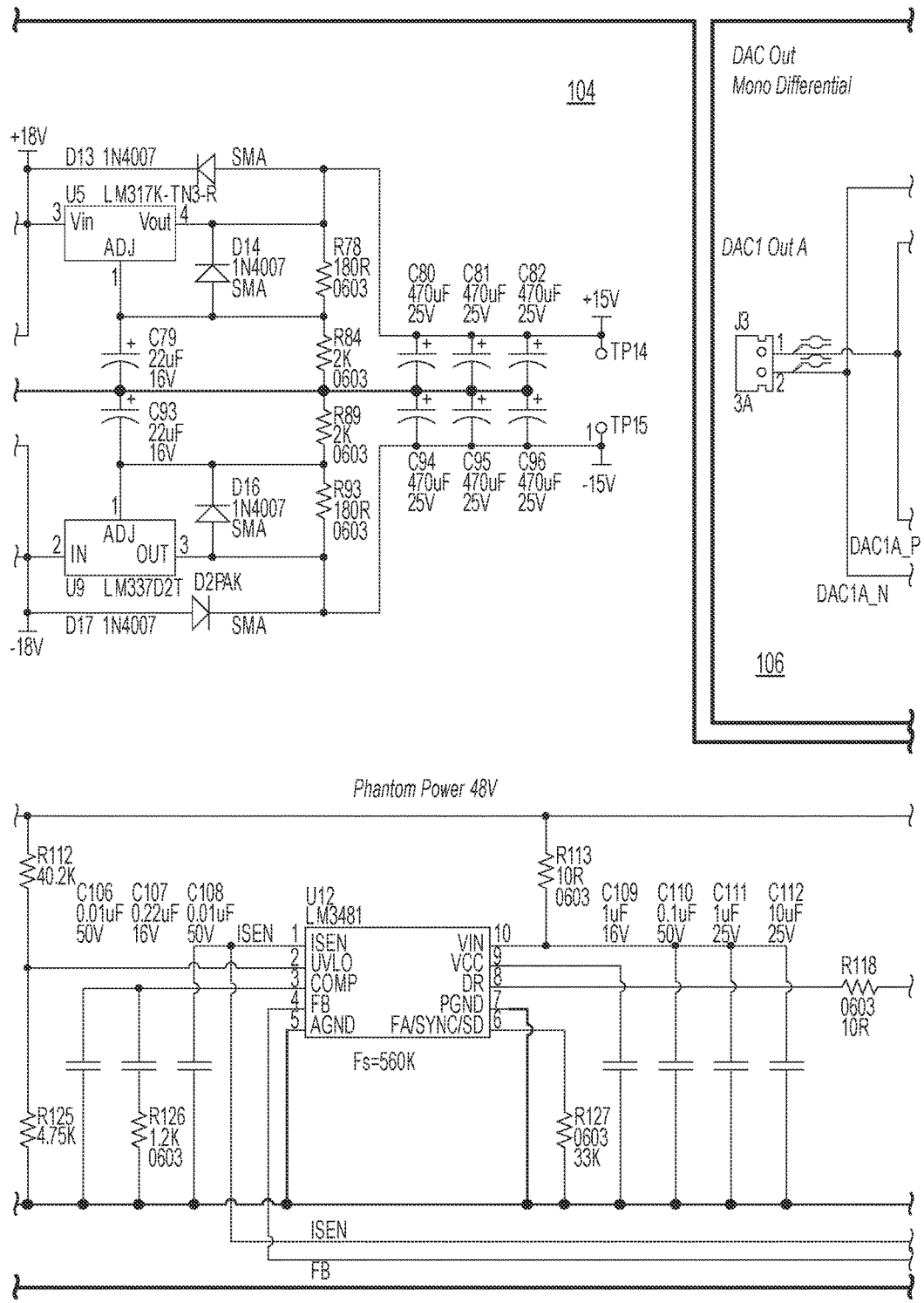
Figure 1:
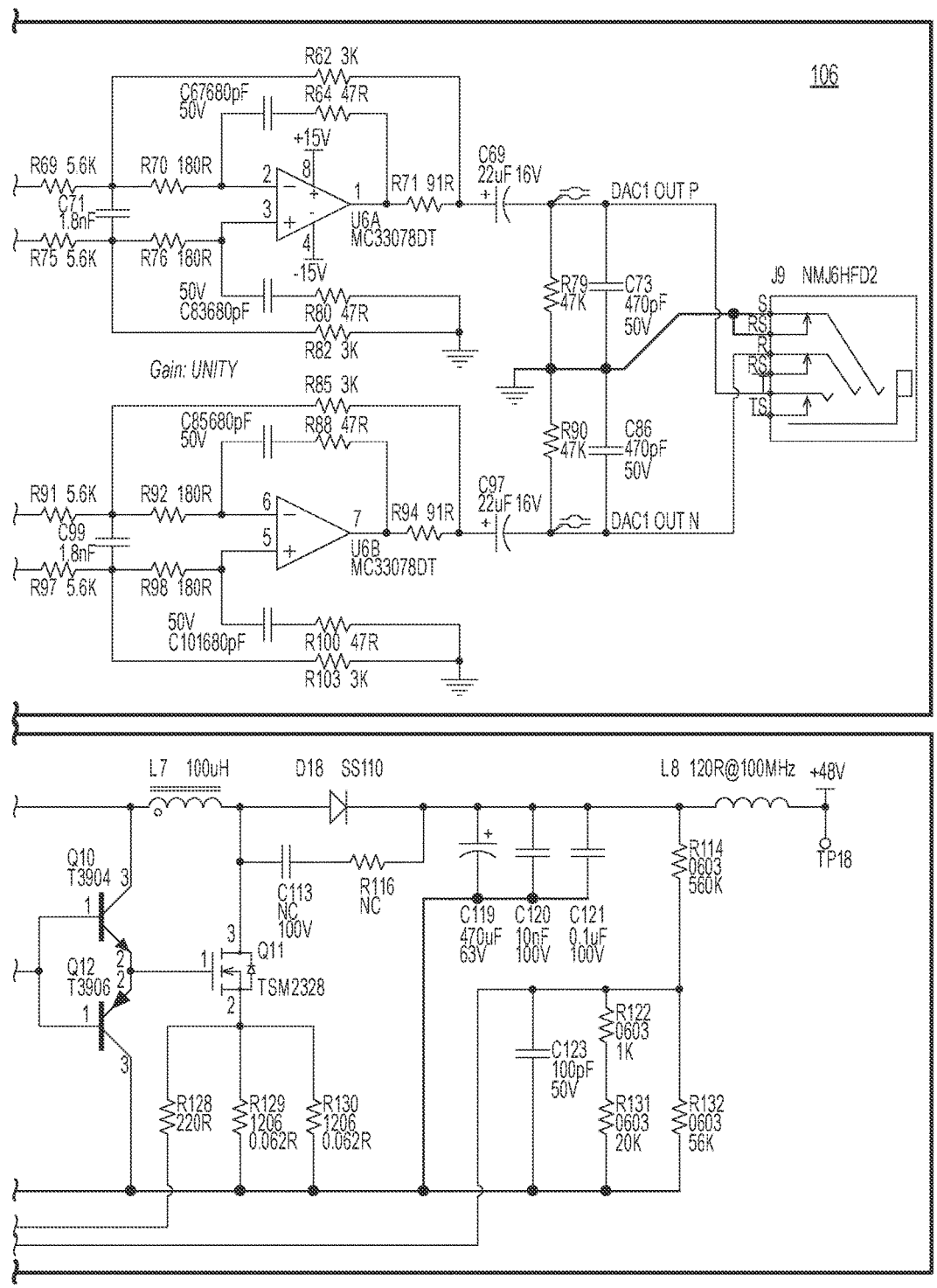
Figure 1:
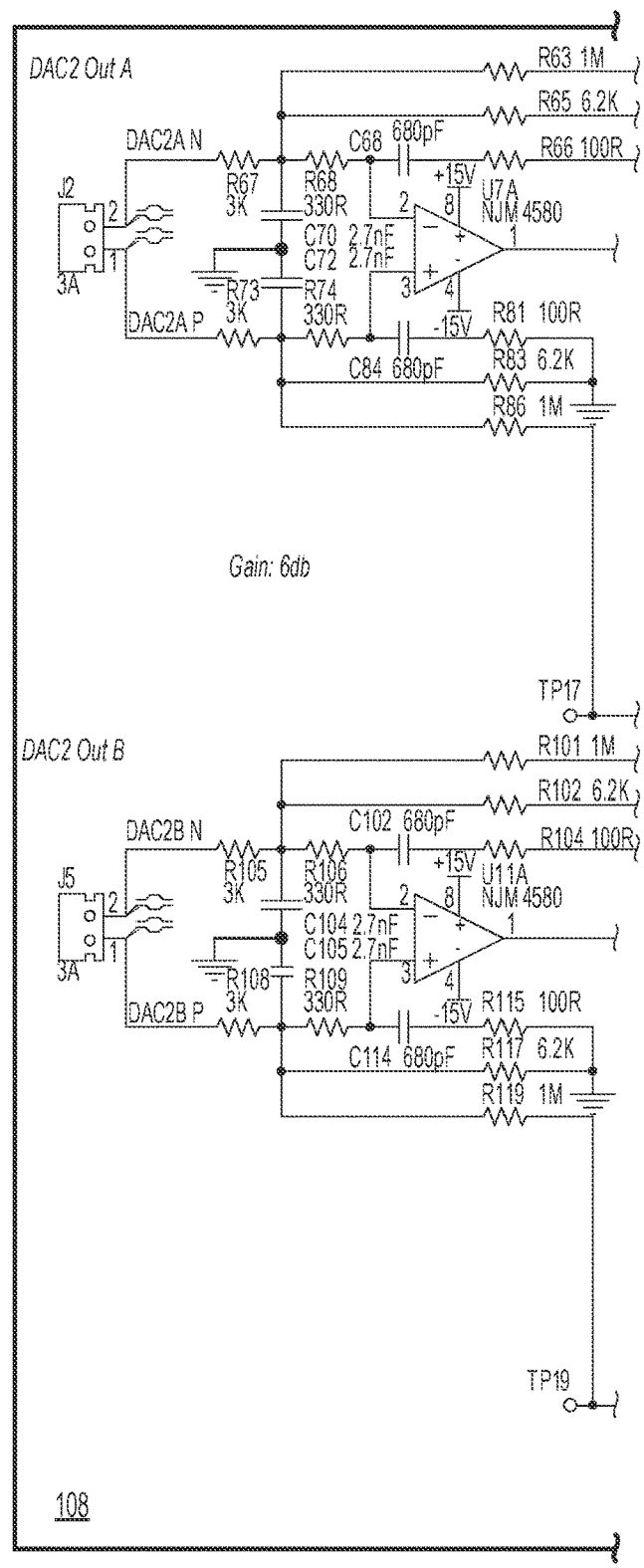
Figure 1:
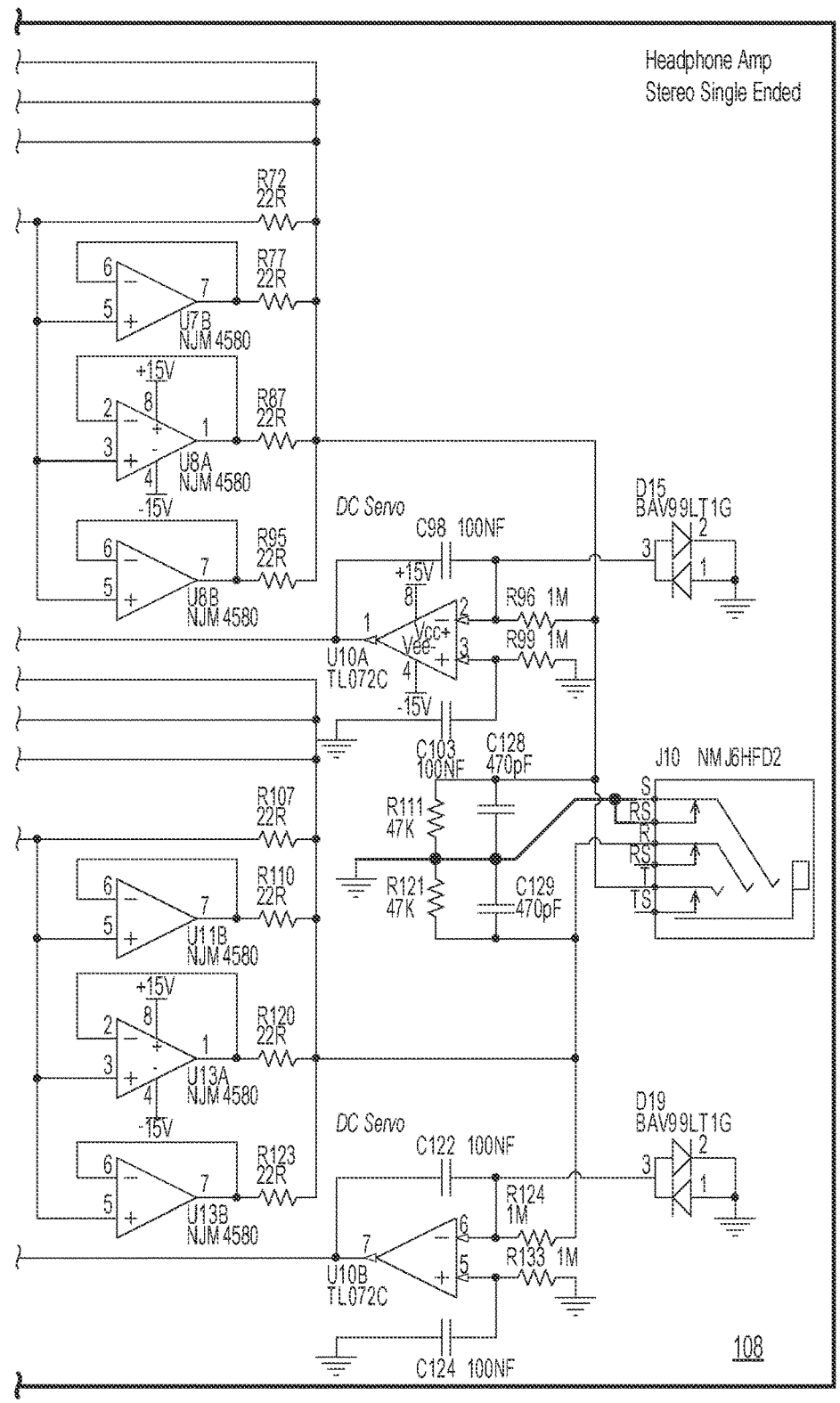

Referring now to FIG. 1, a pre-amplifier circuit 100 is illustrated according to a non-limiting embodiment. The pre-amplifier circuit 100 includes a microphone pre-amplifier stage 102 (i.e., circuit), a PSU 104, a digital-to-analog converter stage 106, and a headphone amplifier stage (108). The microphone pre-amplifier stage includes a direct injection (DI) unit that provides a high impedance source signal and a low impedance XLR connection operable without a line or mic switch. The DI unit may connect a high-impedance source signal (e.g. high-impedance, line level, unbalanced source signal) to a low-impedance, microphone level, balanced input. The XLR connection may include an XLR electrical connector that connects the high-impedance source signal to the low-impedance, microphone input to provide a balanced audio interconnection.

According to a non-limiting embodiment, the DI unit may provide electrical ground isolation between input and output, and they match the impedance of the source signal to that of a load. For example, a DI unit may be implemented with a high input impedance and a low output impedance may be used to match an input device (e.g., guitar, bass, etc.) to the input stage of a second device (e.g., mixing device). In at least one embodiment, the DI unit is an active electrical DI unit that receives phantom power output generated by the PSU 104.

The pre-amplifier circuit further includes self-biasing input component (e.g., transistor pairs) that bias input to an analog-to-digital converter (ADC). The self-biasing input components may be implemented as junction gate field effect transistor (JFET) pairs or operation amplifier pairs. In this manner, a low cost, high current DC coupled headphone output is provided.

Figure 3:
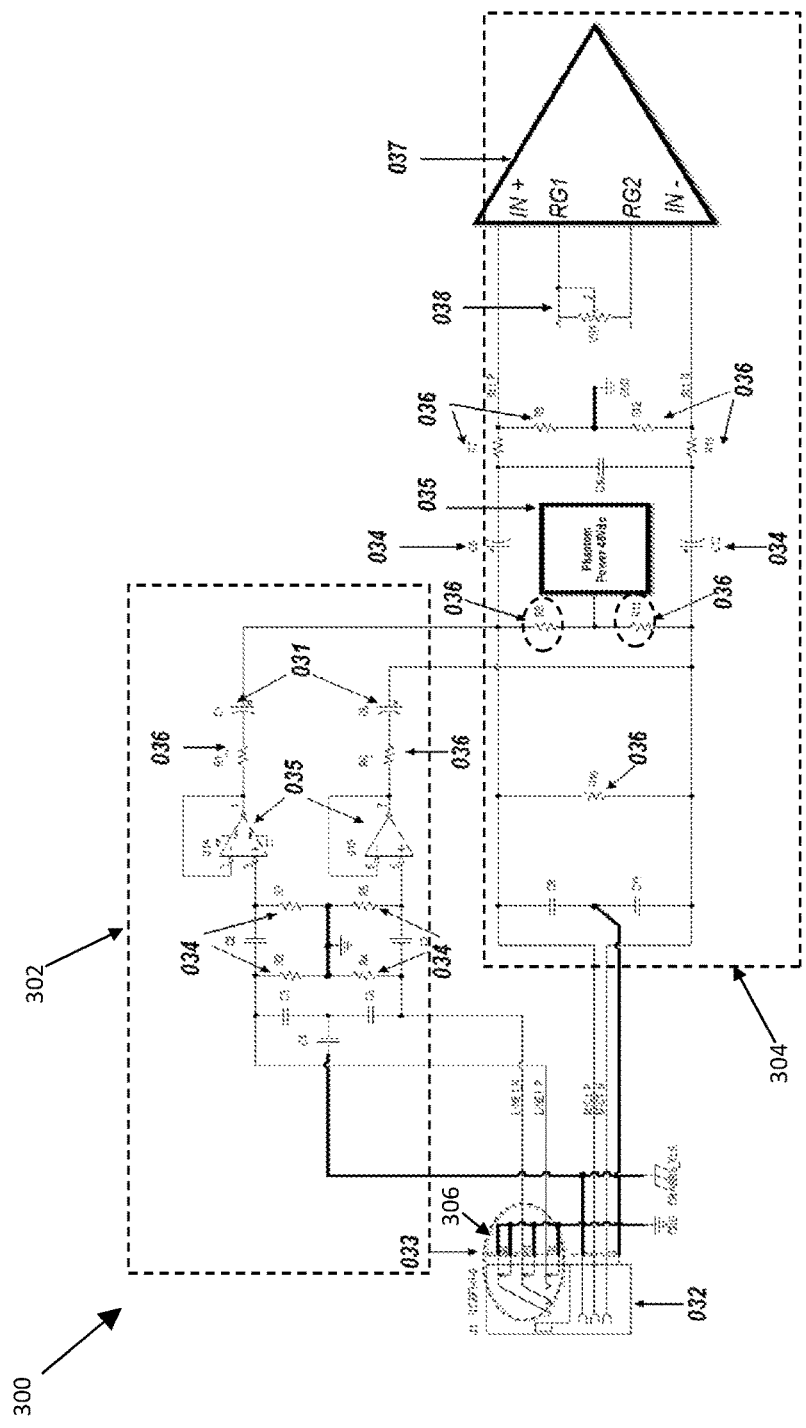
FIG. 3 is a schematic diagram of a switchless line-DI/Mic pre-amplifier input circuit according to a non-limiting embodiment of the invention.

Turning now to FIG. 3, a switchless line-DI/Mic pre-amplifier input circuit 300 (i.e., a switchless L/M input circuit 300) is illustrated according to a non-limiting embodiment. The switchless L/M input circuit 300 utilizes a virtual zero-ohm nature of the line/instruments input OpAmp 035 which is coupled to the circuit impedance of a microphone device based on the connection of a microphone device. In at least one embodiment, the OpAmp 035 inhibits audio signals therethrough directly in response to connecting a microphone device to the switchless line-DI/Mic pre-amplifier input circuit 300. In this manner, the switchless L/M input circuit 300 can transition between a high-impedance instrument/line-level input operating mode and a low impedance microphone input operating mode without the use of a physical (i.e., mechanical) switch or transistor switch.

The switchless L/M input circuit 300 includes an audio input connector 032, a pre-amplifier circuit 302, and an impedance selector circuit 304. In at least one embodiment, the audio input connector 032 is a 3-pole stereo audio connector configured to receive a connection from a microphone device (not shown) and/or a connection from a line-level device or instrumental-level device.

The pre-amplifier circuit 302 includes a pre-stage OpAmp 037, a phantom power supply 035, and divider resistors R8 and R11 (indicated by dashed circles). The pre-stage OpAmp 037 can be a standard instrumentation amplifier circuit or integrated circuit (IC—not shown). The gain of the pre-stage OpAmp can be set by the variable resistor (VR1) 038.

The phantom power supply is configured to supply DC power to a DC audio device such as, for example, a condenser microphone. In at least one embodiment, the phantom power supply generates a voltage of 48 Vdc, which is applied to the audio input connector (i.e. pins 2 and 3). The phantom power supply can also include capacitors 034 to block the output phantom power voltage (e.g., 48 Vdc) from interfering with operation of the pre-stage OpAmp 037. The divider resistors R8 and R11 regulate the output phantom power voltage. In at least one embodiment, the divider resistors R8 and R11 have fixed values (e.g., 6.81 kilo-ohms), which are taken into account when setting the impedance defined by the resistor network 036, i.e., R1, R6, R10, R8, R11, R7, R13, R9 and R12.

The impedance selector circuit 304 includes a pair of input line OpAmps 035. The non-inverting inputs of the input line OpAmps 035 are electrically coupled to the audio input connector 032. An output of a first input line OpAmp 035 (e.g., U1A) is connected to the non-inverting input of the pre-stage OpAmp 037 included in the preamplifier circuit 304. An output of a second input line OpAmp 035 (e.g., U1B) is connected to the non-inverting input of the pre-stage OpAmp 037.

When a microphone connection is achieved at the audio input connector 032, the inputs of the input line OpAmps (U1A and U1B) are shorted by the audio input connector 032, i.e., by connector pins 306 S to SN, R to RN, T to TN (indicated by the dashed oval). Connecting the microphone effectively invokes the low impedance microphone input operating mode of the switchless L/M input circuit 300. Accordingly, the outputs of OpAmps 050 (U1A and U1B) effectively become a virtual ground due the nature of the feedback mechanism, which maintains the output close to zero ohm among the audio-band. The microphone input impedance is defined by a network of resistors 036 including, for example, R1, R6, R10, R8, R11, R7, R13, R9 and R12. The input line OpAmps (U1A and U1B) can be treated as a ground connection as realized by resistors 036 (i.e., R1 and R6) which are connected to the outputs of the input line OpAmps (U1A and U1B). Further, the input line OpAmps (U1A and U1B) effectively serves as an electrical virtual ground. Accordingly, an audio signal is prevented from being output from the input line OpAmps (U1A and U1B) when a microphone is inserted.

When a line-level or instrument-level signal connected is achieved at the audio input connection 032, the input line OpAmps (U1A and U1B) transition into active unity-gain buffer amplifier stages to invoke a high-impedance instrument/line-level input operating mode. Accordingly, the input line OpAmps (U1A and U1B)) isolate the line input from the pre-stage OpAmp 037, and the impedance is defined by the resistor network 036, including resistors R1, R6, R10, R8, R11, R7, R13, R9 and R12. In one or more embodiments, the line-level/instrument-level impedance is set to a high differential impedance (e.g., approximately 500 kilo-ohm to approximately 2 mega-ohms) by resistors R2, R3 R4 and R5. In addition, a combination of a first set of resistors (e.g., R1, R5) together with a second set of resistors R10, R8, R11, R7, R13, R9 and R12 forms a natural voltage divider network which gives signal attenuation required for line level inputs.

As described herein, various embodiments of the disclosure provide a switchless line-DI/Mic pre-amplifier input circuit that can transition between a high-impedance instrument/line-level input operating mode and a low impedance microphone input operating mode without the use of a physical (i.e., mechanical) switch or transistor switch. In at least one embodiment, the a switchless line-DI/Mic pre-amplifier input circuit utilizes virtual zero-ohm output characteristics of an op-amp to integrate two input stages without the need or use of a physical/mechanical switch or transistor switch. In this manner, switchless line-DI/Mic pre-amplifier input circuit reduces component space consumption and overall costs.

As used herein, the term "module" refers to an application specific integrated circuit (ASIC), an electronic circuit, a microprocessor, a computer processor (shared, dedicated, or group) and memory that executes one or more software or firmware programs, a combinational logic circuit, a microcontroller including various inputs and outputs, and/or other suitable components that provide the described functionality. The module is configured to execute various algorithms, transforms, and/or logical processes to generate one or more signals of controlling a component or system. When implemented in software, a module can be embodied in memory as a non-transitory machine-readable storage medium readable by a processing circuit (e.g., a microprocessor) and storing instructions for execution by the processing circuit for performing a method. A controller refers to an electronic hardware controller including a storage unit capable of storing algorithms, logic or computer executable instruction, and that contains the circuitry necessary to interpret and execute instructions.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A switchless pre-amplifier input circuit comprising:
   an audio input connector configured to receive a first audio device operable at a first impedance and a second audio device operable at a second impedance less than the first impedance;
   a preamplifier circuit that outputs a preamplified audio signal in response to amplifying a first audio signal generated by the first audio device or a second audio signal generated by the second audio device;
   an impedance selector circuit including an input in electrical communication with the audio input connector and an output in electrical communication with the preamplifier circuit, the impedance selector circuit configured to adjust an impedance at the output to reach the first impedance in response to connecting the first audio device to the audio input connector and to adjust the impedance at the output to reach the second impedance in response to connecting the second audio device to the audio input,
   wherein the impedance selector circuit including further includes a first operational amplifier and a second operational amplifier that selectively adjust the impedance at the output based on the connection of the first and second audio devices, and
   wherein amplifier inputs of the first and second operational amplifiers are shorted in response to connecting the second audio device such that the amplifier inputs generates a ground reference point so as to force the output to second impedance.

2. The switchless pre-amplifier input circuit of claim 1, wherein the impedance at the output is adjusted without a mechanical switch.

3. The switchless pre-amplifier input circuit of claim 1, wherein the first audio device is at least one of a line-level audio device and instrument-level audio device, and wherein the second audio device is a microphone.

4. The switchless pre-amplifier input circuit of claim 3, wherein the first impedance ranges from about 500 kilo-ohms to about 2 mega-ohms, and the second impedance is about 0 ohms.

5. A method operating a switchless pre-amplifier input circuit, the method comprising:
   receiving, at an audio input connector, a first audio device operable at a first impedance and a second audio device operable at a second impedance less than the first impedance;
   adjusting an impedance at an output of an impedance selector circuit to reach the first impedance in response to connecting the first audio device to the audio input connector and adjusting the impedance at the output to reach the second impedance in response to connecting the second audio device to the audio input; and
   outputting a preamplified audio signal, via the preamplifier circuit, in response to amplifying a first audio signal generated by the first audio device or a second audio signal generated by the second audio device,
   wherein adjusting the impedance at the output to reach the second impedance comprises shorting amplifier inputs of first and second operational amplifiers included in the impedance selector circuit in response to connecting the second audio device to generate a ground reference point between the audio input connector and the impedance selector circuit in response to connecting the second audio device so as to force the output to second impedance.

6. The method of claim 5, wherein the first audio device is at least one of a line-level audio device and instrument-level audio device, and wherein the second audio device is a microphone.

7. The method of claim 5, further comprising adjusting the impedance at the output without operating a mechanical switch.

8. The method of claim 5, wherein the first impedance ranges from about 500 kilo-ohms to about 2 mega-ohms, and the second impedance is about 0 ohms.

* * * * *